United States Patent
Joo et al.

(10) Patent No.: US 11,394,372 B2
(45) Date of Patent: Jul. 19, 2022

(54) WIDE BAND GAP POWER SEMICONDUCTOR SYSTEM AND DRIVING METHOD THEREOF

(71) Applicant: KOREA ELECTRONICS TECHNOLOGY INSTITUTE, Seongnam-si (KR)

(72) Inventors: Dongmyoung Joo, Bucheon-si (KR); Junhyuk Choi, Bucheon-si (KR); Joonsung Park, Seoul (KR); Jinhong Kim, Suwon-si (KR); Byongjo Hyon, Anyang-si (KR); Yongsu Noh, Seoul (KR)

(73) Assignee: Korea Electronics Technology Institute, Seongnam-si (KR)

( * ) Notice: Subject to any disclaimer, the term of this patent is extended or adjusted under 35 U.S.C. 154(b) by 0 days.

(21) Appl. No.: 17/092,843

(22) Filed: Nov. 9, 2020

(65) Prior Publication Data
US 2021/0152158 A1 May 20, 2021

(30) Foreign Application Priority Data
Nov. 14, 2019 (KR) .......... 10-2019-0145898
Nov. 6, 2020 (KR) .......... 10-2020-0147276

(51) Int. Cl.
*H03K 3/012* (2006.01)
(52) U.S. Cl.
CPC .................... *H03K 3/012* (2013.01)
(58) Field of Classification Search
CPC .... H03K 3/012; H03K 17/687; H03K 17/163; H03K 2217/0036
See application file for complete search history.

(56) References Cited

U.S. PATENT DOCUMENTS

| | | | |
|---|---|---|---|
| 11,165,031 B2* | 11/2021 | Lu | H01L 27/3274 |
| 2010/0245335 A1* | 9/2010 | Kimura | G09G 3/3688 345/213 |
| 2013/0214824 A1* | 8/2013 | Umetani | H03K 17/145 327/109 |
| 2016/0247927 A1* | 8/2016 | Nomura | H01L 29/78618 |

FOREIGN PATENT DOCUMENTS

JP    2013-201883 A    10/2013

OTHER PUBLICATIONS

Office Action in Korean Application No. 10-2020-0147276 dated Dec. 16, 2021 in 4 pages.

* cited by examiner

*Primary Examiner* — Sibin Chen
(74) *Attorney, Agent, or Firm* — Knobbe Martens Olson & Bear LLP

(57) ABSTRACT

This application relates to a wide band gap (WBG) power semiconductor system. In one aspect, the system includes a controller configured to generate a switching control signal and a gate driver configured to receive the switching control signal and generate a switching drive signal in response to the switching control signal. The system also includes a WBG power semiconductor device coupled to the gate driver, comprising a gate terminal for receiving the switching drive signal, and configured to be switched in response to the switching drive signal. The switching drive signal has one of three signal levels: a first voltage level higher than a zero voltage level, a second voltage level lower than the zero voltage level, and the zero voltage level at an arbitrary instant. As a result, the gate driver drives the WBG power semiconductor device with the three voltage levels.

9 Claims, 3 Drawing Sheets

WIDE BAND GAP POWER SEMICONDUCTOR SYSTEM AND DRIVING METHOD THEREOF

CROSS-REFERENCE TO RELATED APPLICATION

The present application claims priority to Korean Patent Application No. 10-2019-0145898 filed on Nov. 14, 2019 and 10-2020-0147276 filed on Nov. 6, 2020 in the Korean Intellectual Property Office, each of which is incorporated herein in its entirety by reference.

BACKGROUND

Technical Field

The present disclosure relates to a wide band gap (WBG) power semiconductor and, more particularly, to a WBG power semiconductor system capable of reducing power loss by actively driving a gate driver voltage and a method of driving a WBG power semiconductor device.

Description of Related Technology

A power semiconductor device is a switching device used to convert or control power of a load. The power semiconductor device allows efficient power consumption in substantially all kinds of electric systems such as a maglev train, a solar inverter, an electric vehicle, and the other electric devices, and has been used in a wide range of fields as an essential component influencing stability and reliability of the system.

Power semiconductor device technologies have been developed steadily since 1960s focusing on devices based on silicon (Si) which is the most common semiconductor material. Due to an inherently narrow band gap and a low electron mobility of the silicon material, however, the silicon-based power semiconductor devices have limitations in theoretically attainable performance indexes such as a resistance in a turned-on state, a breakdown voltage, and an operating temperature. Power semiconductor devices having innovative device structures such as a super-junction metal oxide semiconductor field effect transistor (MOSFET) and an insulated-gate bipolar transistor (IGBT) have overcome the theoretical limitations of the power semiconductors to some extent, they still cannot achieve performances required in modern power electronics and wireless communication systems.

SUMMARY

Provided is a wide band gap (WBG) power semiconductor system capable of reducing a conduction loss by applying a negative voltage to a gate of a WBG power semiconductor device at an instant of switching of the WBG power semiconductor device and applying zero voltage to the gate after a certain period of time to control a gate voltage of the WBG power semiconductor device in three levels.

Also, provided is a method of driving the WBG power semiconductor device by three gate voltage levels to reduce the conduction loss in the WBG power semiconductor device.

According to an aspect of an exemplary embodiment, the present disclosure provides a wide band gap (WBG) power semiconductor system, including: a controller configured to generate a switching control signal; a gate driver configured to receive the switching control signal and generate a switching drive signal in response to the switching control signal; and a WBG power semiconductor device coupled to the gate driver, comprising a gate terminal for receiving the switching drive signal, and configured to be switched in response to the switching drive signal. The switching drive signal has one of three signal levels: a first voltage level higher than zero voltage level, a second voltage level lower than the zero voltage level, and the zero voltage level at an arbitrary instant. As a result, the gate driver drives the WBG power semiconductor device with the three levels.

In a course of supplying the switching drive signal of the first voltage level to the gate terminal of the WBG power semiconductor device, the gate driver may change a level of the switching drive signal into the second voltage level to turn the WBG power semiconductor device off and then change the level of the switching drive signal again into the zero voltage level after a predetermined time interval.

A voltage between the gate terminal and a source terminal of the WBG power semiconductor device may transition from the first voltage level to the second voltage level when the switching drive signal transitions from the first voltage level to the second voltage level, and may maintain the zero voltage level after a predetermined time.

A current flowing between a drain terminal and the source terminal of the WBG power semiconductor device may be cut off as the voltage between the gate terminal and the source terminal of the WBG power semiconductor device transitions to the second voltage level.

According to another aspect of an exemplary embodiment, the present disclosure provides a method of driving of a WBG power semiconductor device in a WBG power semiconductor system comprising a gate driver and the WBG power semiconductor device. The method includes: supplying, by the gate driver, a first voltage level higher than a zero voltage level to a gate terminal of the WBG power semiconductor device; supplying, by the gate driver, a second voltage level lower than the zero voltage level to the gate terminal of the WBG power semiconductor device to turn the WBG power semiconductor device off; and supplying, by the gate driver, the zero voltage level to the gate terminal of the WBG power semiconductor device after a predetermined time interval. Thus, the gate driver drives the WBG power semiconductor device with the three levels.

The driving the WBG power semiconductor device with the three levels may include: changing a voltage between the gate terminal and a source terminal of the WBG power semiconductor device from the second voltage level to the zero voltage level and maintaining the zero voltage level after a predetermined time.

The maintaining the zero voltage level may include: cutting off a current flowing between a drain terminal and the source terminal of the WBG power semiconductor device as the voltage between the gate terminal and the source terminal of the WBG power semiconductor device transitions to the second voltage level.

The present disclosure can reduce the conduction loss in the WBG power semiconductor device by controlling the gate voltage of the WBG power semiconductor in three levels.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings.

Figure 1:
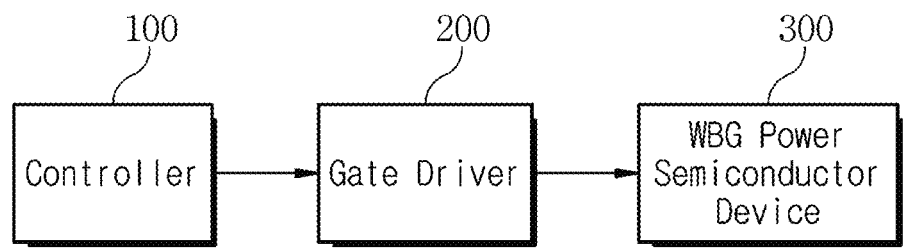
FIG. 1 is a schematic block diagram of a WBG power semiconductor system according to an exemplary embodiment of the present disclosure.

The drawings described herein are for illustration purposes only and are not intended to limit the scope of the present disclosure in any way.

DETAILED DESCRIPTION

In consideration of the limitations of the physical properties of silicon-based power semiconductors, researches for improving the characteristics of the power semiconductors have been focused on semiconductor materials instead of device structures. In particular, gallium nitride (GaN) and silicon carbide (SiC) having a wide band gap (WBG) are drawing attention as next generation power semiconductor materials that may replace silicon-based power semiconductors. Meanwhile, researches on power conversion modules with low power loss are actively being conducted in applications consuming high power such as an electric vehicle.

On the other hand, when a WBG power semiconductor device is to be turned off, zero voltage or a negative voltage should be applied to a gate of the device. The negative voltage is generally preferred to the zero voltage to prevent a switching malfunction. However, when the WBG power semiconductor device operates in a lower left quadrant (i.e. quadrant III) of its I-V characteristic curves, a conduction loss increases as the negative voltage increases. As a result, the conduction loss may become very large when a switching state of the device is turned off by the negative gate voltage and the device operates in the quadrant III of its I-V characteristic curves.

In the following description and the accompanied drawings, only parts necessary for understanding embodiments of the present disclosure will be described, and detailed descriptions of well-known functions or configuration that may obscure the subject matter of the present disclosure will be omitted for simplicity.

The terms and words used in the following description and appended claims are not necessarily to be construed in an ordinary sense or a dictionary meaning, and may be appropriately defined herein to be used as terms for describing the present disclosure in the best way possible. Such terms and words should be construed as meaning and concept consistent with the technical idea of the present disclosure. The embodiments described in this specification and the configurations shown in the drawings are merely preferred embodiments of the present disclosure are not intended to limit the technical idea of the present disclosure. Therefore, it should be understood that there may exist various equivalents and modifications which may substitute the exemplary embodiments at the time of filing of the present application.

Hereinbelow, exemplary embodiments of the present disclosure will be described in detail with reference to the accompanied drawings.

Referring to FIG. 1, a wide band gap (WBG) power semiconductor system according to an exemplary embodiment of the present disclosure may include a controller 100, a gate driver 200, and a WBG power semiconductor device 300.

The controller 100 may generate a control signal for controlling the gate driver 200 and provide the control signal to the gate driver 200. The gate driver 200 may amplify and level-shift the control signal received from the controller 100 to generate a switching drive signal. According to the present disclosure, the switching drive signal, which is provided to the WBG power semiconductor device 300 to turn the WBG power semiconductor device 300 on or off, may have three levels of a positive voltage, a negative voltage, and zero voltage, for example. Since the switching drive signal has three levels including the zero voltage, a conduction loss that may occur when the WBG power semiconductor device 300 is turned off by the negative drive voltage can be reduced, which will be described below in detail.

The gate driver 200 is a power amplifier for producing a high-current drive input for a gate of the WBG power semiconductor device 300 to enable fast switching of the WBG power semiconductor device 300. In this regard, the gate driver 200 may be connected to a gate terminal of the WBG power semiconductor device 300. The gate driver 200 may be additionally connected to a source terminal of the WBG power semiconductor device 300.

The switching drive signal supplied by the gate driver 200 to the gate of the WBG power semiconductor device 300 may have a first voltage level (e.g., a drain bias voltage $V_{DD}$ of the WBG power semiconductor device 300) higher than zero voltage by a certain threshold voltage or more. In addition, the switching drive signal may have a second voltage level (e.g., a source bias voltage Vss of the WBG power semiconductor device 300) lower than the zero voltage by the certain threshold voltage or more. Further, the switching drive signal may have a zero voltage level. To turn the WBG power semiconductor device 300 on, the gate driver 200 may supply the switching drive signal of the first voltage level to the WBG power semiconductor device 300. To turn the WBG power semiconductor device 300 off, the gate driver 200 may supply the switching drive signal of the second voltage level to the WBG power semiconductor device 300 and then supply the switching drive signal of the zero voltage level to the WBG power semiconductor device 300 after the WBG power semiconductor device 300 is turned off.

Figure 2:
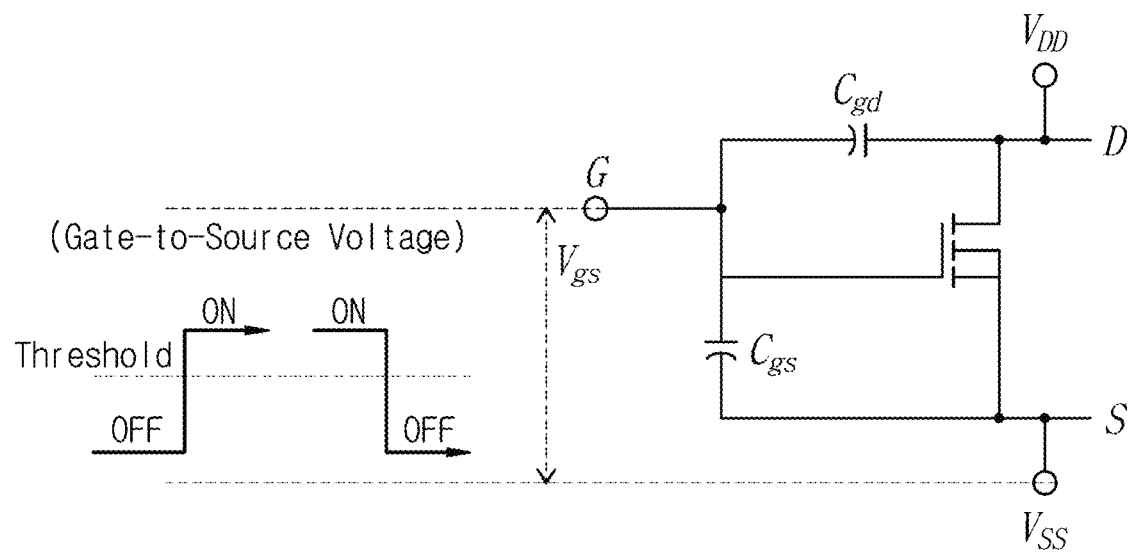
FIG. 2 is an equivalent circuit diagram of a WBG power semiconductor device according to an exemplary embodiment of the present disclosure.

FIG. 2 is an equivalent circuit diagram of the WBG power semiconductor device 300 according to an exemplary embodiment of the present disclosure.

The WBG power semiconductor device 300 shown in the drawing has a structure of a metal oxide semiconductor field effect transistor (MOSFET). However, the present disclosure is not limited thereto, and the WBG power semiconductor device 300 may be another kind of device such as an insulated gate bipolar transistor (IGBT). The WBG power semiconductor device 300 may have a more complicated configuration. For example, the WBG power semiconductor device 300 may have a chain structure such as a CMOS push-pull inverter. The CMOS inverter may include a p-channel MOS (PMOS) serving as a current source and an n-channel MOS (NMOS) switching a state of the inverter actually. The inverter can be implemented through a gallium nitride (GaN) based process. Also, the WBG power semiconductor device 300 may be implemented using a GaN power device integrated into a monolithic integrated circuit. Thus, it should be noted that the present disclosure is not limited to a specific shape or configuration of the WBG power semiconductor device 300, and any power device capable of performing the switching operations based on the switching drive signal having three levels of the first voltage level, the second voltage level, and the zero voltage level supplied by the gate driver 200 may used for the WBG power semiconductor device 300.

Referring to FIG. 2, the WBG power semiconductor device 300 according to an exemplary embodiment of the present disclosure includes a gate terminal G, a drain terminal D, and a source terminal S. The drain bias voltage $V_{DD}$ may be applied to the drain terminal D, and the source bias voltage $V_{SS}$ may be applied to the source terminal S. The switching drive signal having the first voltage level, the second voltage level, or the zero voltage level may be supplied to the gate terminal G. The switching drive signal may form a voltage Vgs between the gate terminal G and the source terminal S.

There may exist a first parasitic capacitor Cgd between the gate and the drain and a second parasitic capacitor Cgs between the gate and the source. The parasitic capacitances are repeatedly charged and discharged during the turning on and off operations of the WBG power semiconductor device 300 and decrease a response speed or the switching speed of the WBG power semiconductor device 300.

A load which consumes the current supplied by the WBG power semiconductor device 300 may be connected to the WBG power semiconductor device 300. In one embodiment, the load may be connected in series with the WBG power semiconductor device 300. In another embodiment where the WBG power semiconductor device 300 is implemented using the CMOS inverter, for example, the load may be connected between a node between the PMOS device and the NMOS device of the CMOS inverter and ground. The load may be at least one component which consumes electrical energy in a maglev train, a solar inverter, an electric vehicle, and the other electric devices.

Figure 3A:
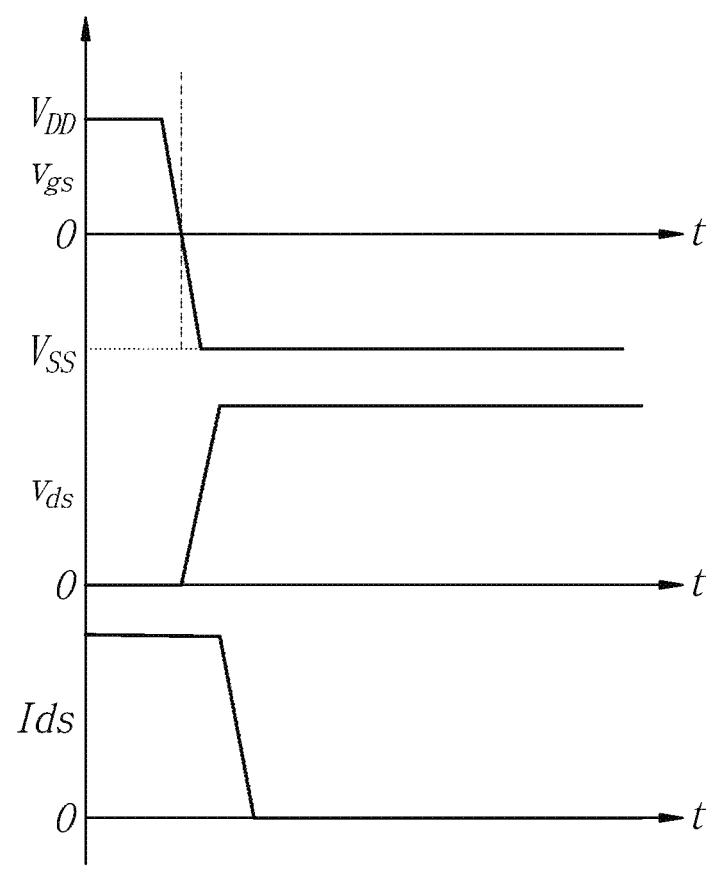
FIGS. 3A and 3B are waveform diagrams for explaining an operation of a gate driver in the WBG power semiconductor system according to an exemplary embodiment of the present disclosure.
Figure 3B:
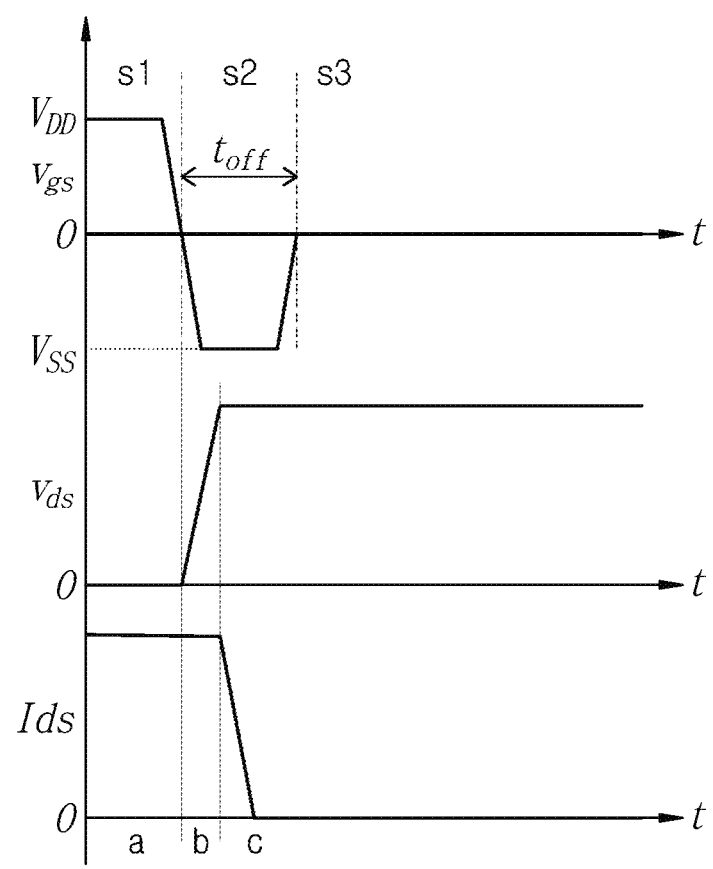

FIGS. 3A and 3B are waveform diagrams for explaining an operation of the gate driver in the WBG power semiconductor system according to an exemplary embodiment of the present disclosure.

According to a driving method illustrated in FIG. 3A, the gate driver 200 may supply the switching drive signal of the first voltage level $V_{DD}$ to the gate terminal G of the WBG power semiconductor device 300 to turn on the WBG power semiconductor device 300. Afterwards, the gate driver 200 may supply the switching drive signal of the second voltage level $V_{SS}$ to the gate terminal G of the WBG power semiconductor device 300 in response to the control signal from the controller 100. As a result, the voltage at the gate terminal G may transition from the first voltage level $V_{DD}$ to the second voltage level $V_{SS}$. As the transition of the switching drive signal from the first voltage level $V_{DD}$ to the second voltage level $V_{SS}$, a voltage Vds between the drain terminal D and the source terminal S may change from zero voltage level to a predetermined voltage level and a current Ids flowing from the drain terminal D and the source terminal S may be cut off.

However, in a lower left quadrant (i.e. quadrant III) of the I-V characteristic curve where a negative voltage is applied to the drain terminal D and a positive voltage is applied to the source terminal S while maintaining the gate terminal G at second voltage level $V_{SS}$, a voltage Vds larger than a conventional power semiconductor may be formed between the drain terminal D and the source terminal S due to the characteristics of the WBG power semiconductor device, and a large conduction loss may occur when a current flows from the drain terminal D to the source terminal S in a reverse direction.

Contrarily, according to a driving method illustrated in FIG. 3B, the gate driver 200 may supply the switching drive signal of the first voltage level $V_{DD}$ to the gate terminal G of the WBG power semiconductor device 300 during a time interval S1 to turn on the WBG power semiconductor device 300. Afterwards, the gate driver 200 may supply the switching drive signal of the second voltage level $V_{SS}$ to the gate terminal G of the WBG power semiconductor device 300 during a time interval S2 in response to the control signal from the controller 100. Subsequently, in a time interval S3, the gate driver 200 may supply the switching drive signal of the zero voltage level to the gate terminal G of the WBG power semiconductor device 300. The switch or the WBG power semiconductor device 300 is turned on while the switching drive signal has the first voltage level $V_{DD}$, but the switch is turned off while the switching drive signal has the second voltage level $V_{SS}$ or the negative voltage. During this process, the switching drive signal having the second voltage level $V_{SS}$ is maintained to lower than a threshold of the switch to prevent a malfunction of the switch.

When the voltage Vgs between the gate terminal G and the source terminal S reaches the zero voltage level during an interval (a) where the switching drive signal transitions from the first voltage level $V_{DD}$ to the second voltage level $V_{SS}$, the voltage Vds between the drain terminal D and the source terminal S may increase from the zero voltage level to the predetermined voltage level and the current Ids flowing from the drain terminal D and the source terminal S may be cut off.

On the other hand, after the first and second time intervals S1 and S2 in which the WBG power semiconductor device 300 is being switched, the switching drive signal of the zero voltage level is supplied to the gate terminal G from a third time interval S3. Since the switching drive signal supplied to the gate terminal G maintains the zero voltage level, the current Ids flowing through the WBG power semiconductor device 300 may converge to zero, and conduction loss may be prevented after the completion of the switching operation. Therefore, since the voltage Vgs between the gate terminal G and the source terminal S is maintained at the zero voltage level after the completion of the switching operation, the conduction loss of the switch arising from the operation of the WBG power semiconductor device 300 in the lower left quadrant (i.e. quadrant III) of the I-V characteristic curve. Meanwhile, since the switching drive signal is driven to the second voltage level Vss when the switch is to be turned off, the malfunction of the switch is prevented similarly to the driving method of FIG. 3A.

As described above, according to the WBG power semiconductor system of the present disclosure, the negative voltage is supplied to the gate of the switching device only when the switching device is being switched into the turned-off state, and the zero voltage is supplied to the gate of the switching device once the switching device is switched into the turned-off state. The control of the gate voltages in three voltage levels by the gate driver may be accomplished without any additional external device. The timing of supplying the zero level voltage in the second time interval S2 may be adjusted by a passive device circuits or an integrated circuit chip in the gate driver 200.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A wide band gap (WBG) power semiconductor system, comprising:
 a controller configured to generate a switching control signal;
 a gate driver configured to receive the switching control signal and generate a switching drive signal by amplifying and level-shifting the received switching control signal; and
 a WBG power semiconductor device coupled to the gate driver and comprising a gate terminal configured to receive the switching drive signal, the WBG power semiconductor device configured to be switched in response to the switching drive signal,
 wherein the switching drive signal has one of three signal levels: a first voltage level higher than a zero voltage level, a second voltage level lower than the zero voltage level, and the zero voltage level at an arbitrary instant, so that the gate driver drives the WBG power semiconductor device with the three signal levels, and
 wherein the gate driver is further configured to:
  supply the switching drive signal having the first voltage level to the gate terminal of the WBG power semiconductor device during a first time interval to turn on the WBG power semiconductor device;
  supply the switching drive signal having the second voltage level to the gate terminal of the WBG power semiconductor device during a second time interval in response to the switching control signal received from the controller, wherein the second time interval is longer than the first time interval; and
  supply the switching drive signal having the zero voltage level to the gate terminal of the WBG power semiconductor device during a third time interval.

2. The WBG power semiconductor system of claim 1, wherein, in a course of supplying the switching drive signal of the first voltage level to the gate terminal of the WBG power semiconductor device, the gate driver is configured to change a level of the switching drive signal to the second voltage level to turn off the WBG power semiconductor device and then change the level of the switching drive signal back to the zero voltage level after a predetermined time interval.

3. The WBG power semiconductor system of claim 2, wherein the WBG power semiconductor device further comprises a source terminal, and
 wherein a voltage between the gate terminal and the source terminal of the WBG power semiconductor device is configured to transition from the first voltage level to the second voltage level when the switching drive signal transitions from the first voltage level to the second voltage level, and maintain the zero voltage level after a predetermined time.

4. The WBG power semiconductor system of claim 3, wherein the WBG power semiconductor device further comprises a drain terminal, and
 wherein a current flowing between the drain terminal and the source terminal of the WBG power semiconductor device is configured to be cut off as the voltage between the gate terminal and the source terminal of the WBG power semiconductor device transitions to the second voltage level.

5. The WBG power semiconductor system of claim 1, wherein the gate driver is configured to maintain the switching drive signal having the second voltage level to be lower than a threshold of the WBG power semiconductor device so as to prevent a malfunction of the WBG power semiconductor device.

6. The WBG power semiconductor system of claim 1, wherein the gate driver comprises a passive device circuit or an integrated circuit chip configured to adjust timing of supplying the zero voltage level to the gate terminal of the WBG power semiconductor device.

7. A method of driving of a wide band gap (WBG) power semiconductor device in a WBG power semiconductor system comprising a gate driver and the WBG power semiconductor device, the method comprising:
 supplying, by the gate driver, a first voltage level higher than a zero voltage level to a gate terminal of the WBG power semiconductor device;
 supplying, by the gate driver, a second voltage level lower than the zero voltage level to the gate terminal of the WBG power semiconductor device to turn off the WBG power semiconductor device; and
 supplying, by the gate driver, the zero voltage level to the gate terminal of the WBG power semiconductor device after a predetermined time interval,
 wherein the gate driver drives the WBG power semiconductor device with the three voltage levels, and
 wherein the gate driver receives a switching control signal from a controller and generates the first, second and third voltage levels by amplifying and level-shifting the received switching control signal,
 the method further comprising:
  supplying, by the gate driver, the switching drive signal having the first voltage level to the gate terminal of the WBG power semiconductor device during a first time interval to turn on the WBG power semiconductor device;
  supplying, by the gate driver, the switching drive signal having the second voltage level to the gate terminal of the WBG power semiconductor device during a second time interval in response to the switching control signal received from the controller, wherein the second time interval is longer than the first time interval; and
  supplying, by the gate driver, the switching drive signal having the zero voltage level to the gate terminal of the WBG power semiconductor device during a third time interval.

8. The method of claim 7, wherein driving the WBG power semiconductor device with the three voltage levels comprises:
 changing a voltage between the gate terminal and a source terminal of the WBG power semiconductor device from the second voltage level to the zero voltage level and maintaining the zero voltage level after a predetermined time.

9. The method of claim 8, wherein maintaining the zero voltage level comprises:
 cutting off a current flowing between a drain terminal and the source terminal of the WBG power semiconductor device as the voltage between the gate terminal and the source terminal of the WBG power semiconductor device transitions to the second voltage level.

* * * * *